United States Patent
Kim

(10) Patent No.: US 8,780,646 B2
(45) Date of Patent: Jul. 15, 2014

(54) SEMICONDUCTOR MEMORY DEVICE

(75) Inventor: Yong-Mi Kim, Gyeonngi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 13/404,734

(22) Filed: Feb. 24, 2012

(65) Prior Publication Data

US 2013/0114352 A1    May 9, 2013

(30) Foreign Application Priority Data

Nov. 7, 2011  (KR) .................... 10-2011-0115255

(51) Int. Cl.
  *G11C 7/10* (2006.01)
  *G11C 7/00* (2006.01)
  *G11C 8/00* (2006.01)
  *G11C 8/18* (2006.01)

(52) U.S. Cl.
  USPC . 365/189.05; 365/193; 365/194; 365/230.06; 365/233.1; 365/233.11; 365/233.12

(58) Field of Classification Search
  USPC ............ 365/189.05, 193, 194, 230.06, 233.1, 365/233.11, 233.12
  See application file for complete search history.

(56) References Cited

U.S. PATENT DOCUMENTS

| | | | | |
|---|---|---|---|---|
| 6,363,029 B1 * | 3/2002 | Watanabe et al. | ......... | 365/230.06 |
| 6,724,684 B2 * | 4/2004 | Kim | ......... | 365/189.05 |
| 6,965,532 B2 * | 11/2005 | Shim | ......... | 365/194 |
| 7,212,449 B2 * | 5/2007 | Lee | ......... | 365/189.05 |
| 7,411,842 B2 * | 8/2008 | Shin | ......... | 365/193 |
| 7,830,731 B2 * | 11/2010 | Kim et al. | ......... | 365/189.05 |
| 7,936,636 B2 * | 5/2011 | Jeong | ......... | 365/233.1 |
| 7,983,095 B2 * | 7/2011 | Kim et al. | ......... | 365/189.05 |
| 7,995,404 B2 * | 8/2011 | Park | ......... | 365/233.1 |
| 8,305,819 B2 * | 11/2012 | Kim et al. | ......... | 365/189.05 |
| 8,498,175 B2 * | 7/2013 | Lee | ......... | 365/189.05 |

FOREIGN PATENT DOCUMENTS

| | | |
|---|---|---|
| KR | 100506976 | 8/2005 |
| KR | 10066873 | 1/2007 |
| KR | 100733461 | 6/2007 |
| KR | 1020100076806 | 7/2010 |

* cited by examiner

*Primary Examiner* — Trong Phan
(74) *Attorney, Agent, or Firm* — IP & T Group LLP

(57) ABSTRACT

A semiconductor memory device includes a pipe latch circuit configured to receive parallel input data and output serial data or set an output terminal of the pipe latch circuit at a predetermined voltage level in response to an enable signal, and a synchronization circuit configured to output an output data of the pipe latch circuit in synchronization with an internal clock.

17 Claims, 7 Drawing Sheets

SEMICONDUCTOR MEMORY DEVICE

CROSS-REFERENCE TO RELATED APPLICATIONS

The present application claims priority of Korean Patent Application No. 10-2011-0115255, filed on Nov. 7, 2011, which is incorporated herein by reference in its entirety.

BACKGROUND

1. Field

Exemplary embodiments of the present invention relate to a semiconductor memory device, and more particularly, to a data output path of a semiconductor memory device.

2. Description of the Related Art

FIG. 1 illustrates a data output path of a conventional semiconductor memory device.

Referring to FIG. 1, the data output path 100 of a conventional semiconductor memory device includes a clock generator 110, a pipe latch 120, a pipe latch driver 130, a trigger 140, a pre-driver 150, and an output buffer 160. The clock generator 110 generates differential internal clocks RCLKDO, RCLKDOB, FCLKDO, and FCLKDOB in response to delay locked loop clocks RCLKDLL and FCLKDLL that are generated in a delay locked loop (DLL) (not shown). The pipe latch 120 serially outputs serial data RDOB and FDOB based on inputted data DATA in parallel in synchronization with falling and rising edges of a source clock. The pipe latch driver 130 drives the serial data RDOB and FDOB to output data RDODB and FDODB. The trigger 140 receives the data RDODB and FDODB and outputs a data UPDNB in synchronization with the differential internal clocks RCLKDO, RCLKDOB, FCLKDO, and FCLKDOB in response to an DDT bar signal ODTB and a DQS preamble fixing signal QPRE. The pre-driver 150 controls slew rate of the data UPDNB to output data RDATA and FDATA. The output buffer 160 receives the data RDATA and FDATA from the pre-driver 150 and outputs them to a data pad DQ.

FIG. 2 is a block diagram illustrating an internal structure of the clock generator 110 shown in FIG. 1.

Referring to FIG. 2, the clock generator 110 includes an inverter chain which includes inverters IV00, IV01, IV02, and IV03, and an inverter chain which includes inverters IV00', IV01', IV02', and IV03'. The clock generator 110 receives the delay locked loop clock RCLKDLL and FCLKDLL and outputs the differential internal clocks RCLKDO, RCLKDOB, FCLKDO, and FCLKDOB. Herein, the differential internal clocks RCLKDO, RCLKDOB, FCLKDO, and FCLKDOB include differential internal clocks RCLKDO and RCLKDOB that are synchronized with a rising edge of the delay locked loop clock RCLKDLL, and differential internal clocks FCLKDO and FCLKDOB that are synchronized with a rising edge of the delay locked loop clock FCLKDLL.

FIG. 3 is a block diagram illustrating an internal structure of the pipe latch driver 130 shown in FIG. 1.

Referring to FIG. 3, the pipe latch driver 130 includes a first driving unit 131 and a second driving unit 133. The first driving unit 131 drives and outputs the data RDOB synchronized with the rising edge of the source clock. The second driving unit 133 drives and outputs the data FDOB synchronized with the falling edge of the source clock.

Herein, the first driving unit 131 includes a first PMOS transistor PP00, a second PMOS transistor PP01, a first NMOS transistor NN00, a second NMOS transistor NN01, and a first inverter IV04. The first PMOS transistor PP00 receives a ground voltage VSS through a gate, and includes a source and a drain coupled between a power source voltage (VDD) terminal and a first coupling node N00. The second PMOS transistor PP01 receives the data RDOB synchronized with the rising edge of the source clock through a gate, and includes a source and a drain coupled between the first coupling node N00 and a first output node ON00. The first NMOS transistor NN00 receives the data RDOB synchronized with the rising edge of the source clock through a gate, and includes a source and a drain coupled between the first output node ON00 and a second coupling node N01. The second NMOS transistor NN01 receives a power source voltage VDD through a gate, and includes a drain and a source coupled between the second coupling node N01 and a ground voltage (VSS) terminal. The first inverter IV04 inverts the output of the first output node ON00 and outputs an inverted output.

The second driving unit 133 has the same structure as the first driving unit 131, except that the data FDOB synchronized with the falling edge of the source clock is received. Thus, for the sake of convenience, further description on the second driving unit 133 is omitted herein.

FIG. 4 is a block diagram illustrating an internal structure of the trigger 140 shown in FIG. 1.

Referring to FIG. 4, the trigger 140 includes a first synchronization unit 141, a second synchronization unit 143, a first voltage level fixing unit 145, a second voltage level fixing unit 147, and an inversion unit 149.

The first synchronization unit 141 synchronizes the data RDODB in synchronization with the differential internal clocks RCLKDO and RCLKDOB and outputs a resultant signal to the second output node ON01. As described above, the data RDODB is synchronized with the rising edge of the source clock and received from the pipe latch driver 130. The differential internal clocks RCLKDO and RCLKDOB are synchronized with a rising edge of the delay locked loop clock RCLKDLL at the clock generator 110. The second synchronization unit 143 synchronizes the data FDODB in synchronization with the differential internal clocks FCLKDO and FCLKDOB and outputs a resultant signal to the second output node ON01. As described above, the data FDODB is synchronized with the falling edge of the source clock and received from the pipe latch driver 130. The differential internal clocks FCLKDO and FCLKDOB are synchronized with a falling edge of the delay locked loop clock FCLKDLL at the clock generator 110. The first voltage level fixing unit 145 fixes the second output node ON01 to the level of the power source voltage VDD in response to the ODT bar signal ODTB. The second voltage level fixing unit 147 fixes the second output node ON01 to the level of the ground voltage VSS in response to the DQS preamble fixing signal QPRE. The inversion unit 149 is coupled with the second output node ON01 and output a data UPDNB synchronized with the delay locked loop clocks RCLKDLL and FCLKDLL.

Herein, the first synchronization unit 141 includes a third PMOS transistor PP02, a fourth PMOS transistor PP03, a third NMOS transistor NN02, and a fourth NMOS transistor NN03. The third PMOS transistor PP02 receives an inverted differential internal clock RCLKDOB between the differential internal clocks RCLKDO and RCLKDOB that are synchronized with the rising edge of the delay locked loop clock RCLKDLL through a gate, and includes a source and a drain coupled between the power source voltage (VDD) terminal and a third coupling node N02. The fourth PMOS transistor PP03 receives a data RDODB, which is received from the pipe latch driver 130 and synchronized with the rising edge of the source clock, through a gate, and includes a source and a drain coupled between the third coupling node N02 and a second output node ON01. The third NMOS transistor NN02 receives the data RDODB, which is received from the pipe latch driver 130 and synchronized with the rising edge of the source clock, through a gate, and includes a drain and a source coupled between the second output node ON01 and a fourth coupling node N03. The fourth NMOS transistor NN03 receives an uninverted differential internal clock RCLKDO between the differential internal clocks RCLKDO and RCLKDOB that are synchronized with the rising edge of the delay locked loop clock RCLKDLL through a gate, and includes a drain and a source coupled between the fourth coupling node N03 and the ground voltage (VSS) terminal.

The second synchronization unit 143 includes a fifth PMOS transistor PP04, a sixth PMOS transistor PP05, a fifth NMOS transistor NN04, and a sixth NMOS transistor NN05. The fifth PMOS transistor PP04 receives an inverted differential internal clock FCLKDOB between the differential internal clocks FCLKDO and FCLKDOB that are synchronized with the falling edge of the delay locked loop clock FCLKDLL through a gate, and includes a source and a drain coupled between the power source voltage (VDD) terminal and a fifth coupling node N04. The sixth PMOS transistor PP05 receives a data FDODB, which is received from the pipe latch driver 130 and synchronized with the falling edge of the source clock, through a gate, and includes a source and a drain coupled between the fifth coupling node N04 and the second output node ON01. The fifth NMOS transistor NN04 receives the data FDODB, which is received from the pipe latch driver 130 and synchronized with the falling edge of the source clock, through a gate, and includes a drain and a source coupled between the second output node ON01 and a fifth coupling node N04. The sixth NMOS transistor NN05 receives an uninverted differential internal clock FCLKDO between the differential internal clocks FCLKDO and FCLKDOB that are synchronized with the falling edge of the delay locked loop clock FCLKDLL through a gate, and includes a drain and a source coupled between the sixth coupling node N05 and the ground voltage (VSS) terminal.

Also, the first voltage level fixing unit 145 includes a seventh PMOS transistor PP06 which receives the ODT bar signal ODTB through a gate, and includes a source and a drain coupled between the power source voltage (VDD) terminal and the second output node ON01. The seventh PMOS transistor PP06 receives the DQS preamble fixing signal QPRE through a gate and includes a source and a drain coupled between the ground voltage (VSS) terminal and the second output node ON01.

Hereinafter, an operation of the semiconductor memory device 100 in accordance with the above structure will be described.

When a data is read from a memory cell region (not shown in the drawings) upon a read operation, the pipe latch 120 converts the data DATA inputted in parallel into the serial data RDOB and FDOB and outputs the serial data RDOB and FDOB to the pipe latch driver 130. The pipe latch driver 130 drives the serial data RDOB and FDOB to output the data RDODB and FDODB to the trigger 140. The trigger 140 synchronizes the data RDODB and FDODB outputted from the pipe latch driver 130 with the differential internal clocks RCLKDO, RCLKDOB, FCLKDO, and FCLKDOB and outputs the data UPDNB to the pre-driver 150. The pre-driver 150 controls the slew rate of the data UPDNB outputted from the trigger 140 and outputs the data RDATA and FDATA to the output buffer 160. The output buffer 160 receives the data RDATA and FDATA and outputs them to the data pad DQ. As a result, the data outputted from the data pad DQ may be synchronized with a system clock so as to perform a stable read operation.

Meanwhile, when the semiconductor memory device enters an On Die Termination (ODT) mode, the ODT bar signal ODTB is enabled to a logic low level and the output UPDNB terminal of the trigger 140 is set to a logic low level. Then, any one between a structure for a pull-up operation and a structure for a pull-down operation operates among the circuit elements included in the pre-driver 150 and the output buffer 160, and the pre-driver 150 and the output buffer 160 are used as an ODT unit.

Also, when the DQS preamble fixing signal QPRE has a preamble period of a data strobe signal (DQS) as an enable period and is enabled to a logic high level during a read operation, the output UPDNB terminal of the trigger 140 is set to a logic high level. Then, as the output of the output buffer 160 is finally set to a predetermined voltage level, e.g., a logic high level, it indicates that the period is a preamble period of the data strobe signal (DQS).

However, the semiconductor memory device 100 having the above structure may have the following concerns.

The trigger 140 performs diverse operation according to a predetermined control signals such as the DQS preamble fixing signal QPRE and the ODT bar signal ODTB, other than an operation of transferring the data RDODB and FDODB that are outputted from the pipe latch driver 130. In short, the semiconductor memory device 100 enables the ODT unit by controlling the output terminal of the trigger 140 or represents that the period is the preamble period of the data strobe signal (DQS), while transferring data through the trigger 140. To this end, the trigger 140 includes the first voltage level fixing unit 145 and the second voltage level fixing unit 147, and the first voltage level fixing unit 145 and the second voltage level fixing unit 147 are implemented by using, for example, transistors. Therefore, the output UPDNB terminal of the trigger 140 has a deteriorated duty and jitter due to the coupling loading of the transistors.

Moreover, the transistors included in the first voltage level fixing unit 145 and the second voltage level fixing unit 147 may be desirable to have a size of greater than a predetermined size. As the size of the transistor is increased, the coupling load of the transistors is increased and duty characteristics may be deteriorated. Herein, since an enable period of the ODT unit and the preamble period of the data strobe signal (DQS) are decided according to specification and the output UPDNB of the trigger 140 should be driven up to a predetermined voltage level within a predetermined time, the transistors may be desirable to have a size of greater than a predetermined size. Meanwhile, since the trigger 140 basically outputs the data UPDNB in synchronization with the delay locked loop clocks RCLKDLL and FCLKDLL that are generated in a delay locked loop (not shown), it may be difficult to correct the duty of the data UPDNB outputted from the trigger 140.

As the first voltage level fixing unit 145 and the second voltage level fixing unit 147 are coupled with the second output node ON01 of the trigger 140, the output UPDNB of the trigger 140 may have a deteriorated duty characteristics. Furthermore, as the sizes of the transistors included in the first voltage level fixing unit 145 and the second voltage level fixing unit 147 may be increased and the duty characteristic may be more deteriorated, the semiconductor memory device 100 may some concerns in that operation reliability and stability are not secured in a high frequency and low power source voltage VDD.

SUMMARY

An exemplary embodiment of the present invention is directed to a semiconductor memory device with improved duty characteristics of data that are read during a read operation.

In accordance with an exemplary embodiment of the present invention, a semiconductor memory device includes a pipe latch circuit configured to receive parallel input data and output serial data or set an output terminal of the pipe latch circuit at a predetermined voltage level in response to an enable signal, and a synchronization circuit configured to output an output data of the pipe latch circuit in synchronization with an internal clock.

In accordance with another exemplary embodiment of the present invention, a semiconductor memory device includes an output control signal generation circuit configured to generate an output control signal, wherein the output control signal is enabled when any one of a first enable signal and a second enable signal is enabled, a pipe latch circuit configured to receive parallel input data and output serial data through an output terminal of the pipe latch circuit or set the output terminal at a predetermined voltage level according to the first enable signal, the second enable signal, and the output control signal, and a synchronization circuit configured to output an output data of the pipe latch circuit in synchronization with an internal clock.

DETAILED DESCRIPTION

Figure 1:
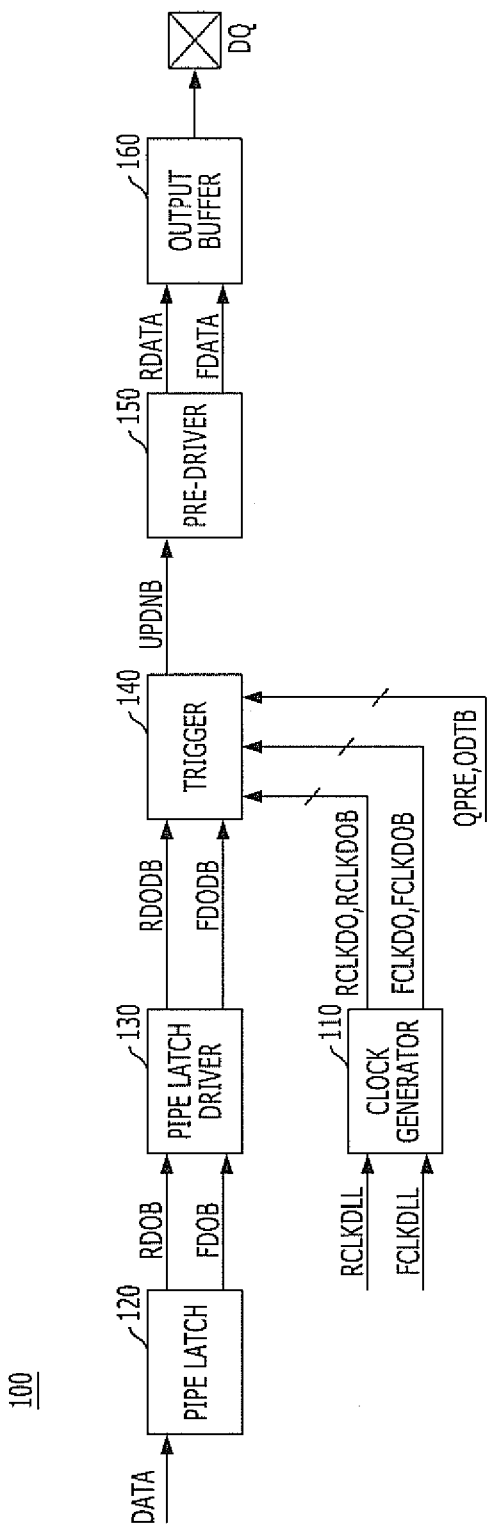
FIG. 1 is a block diagram illustrating a conventional semiconductor memory device.
Figure 2:
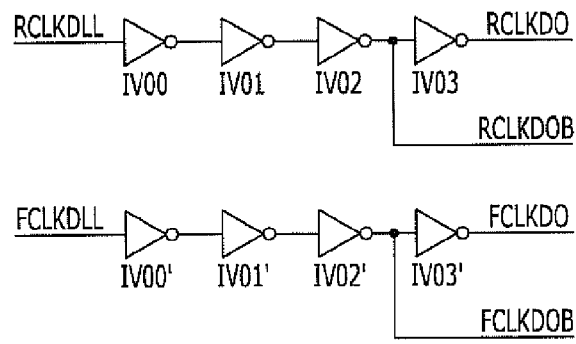
FIG. 2 is a block diagram illustrating an internal structure of a clock generator shown in FIG. 1.
Figure 3:
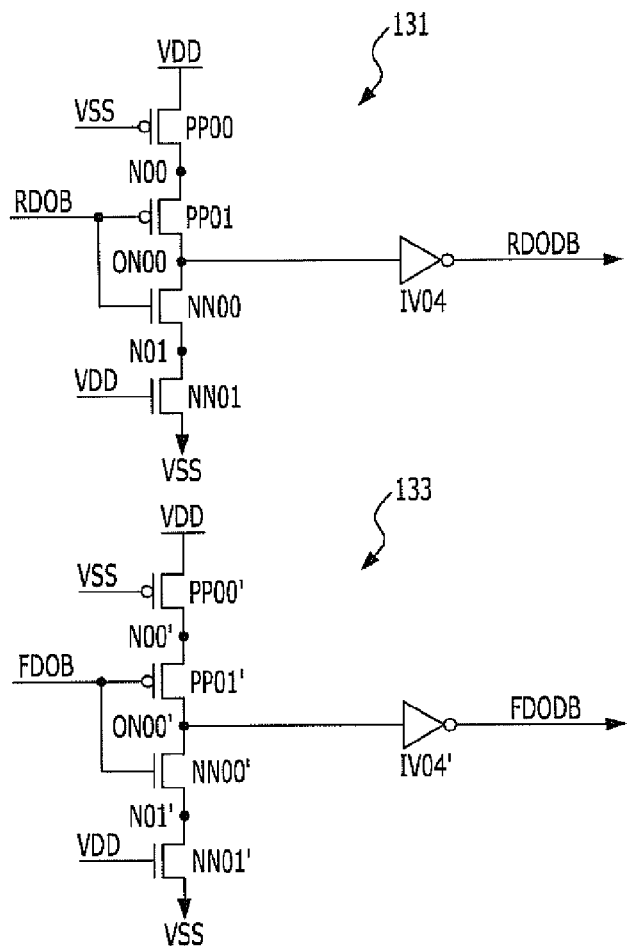
FIG. 3 is a block diagram illustrating an internal structure of a pipe latch driver shown in FIG. 1.
Figure 4:
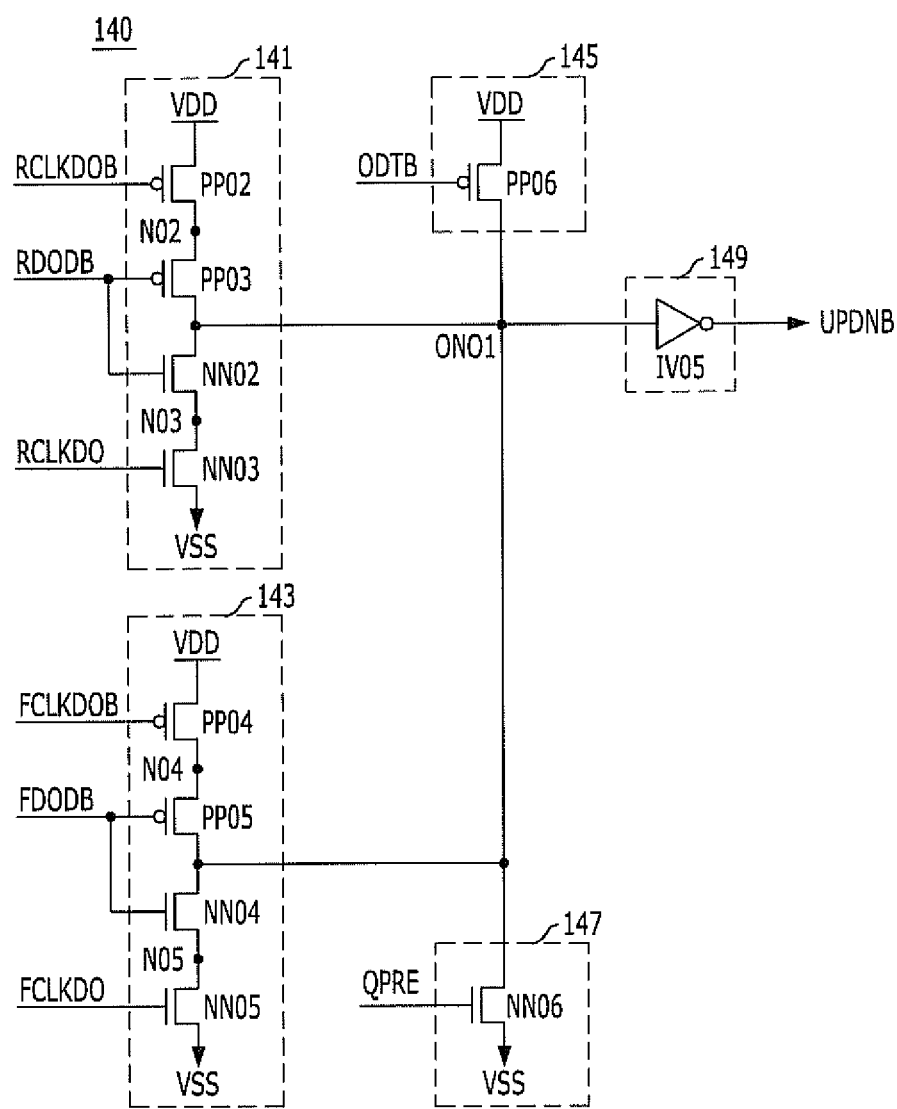
FIG. 4 is a block diagram illustrating an internal structure of a trigger shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
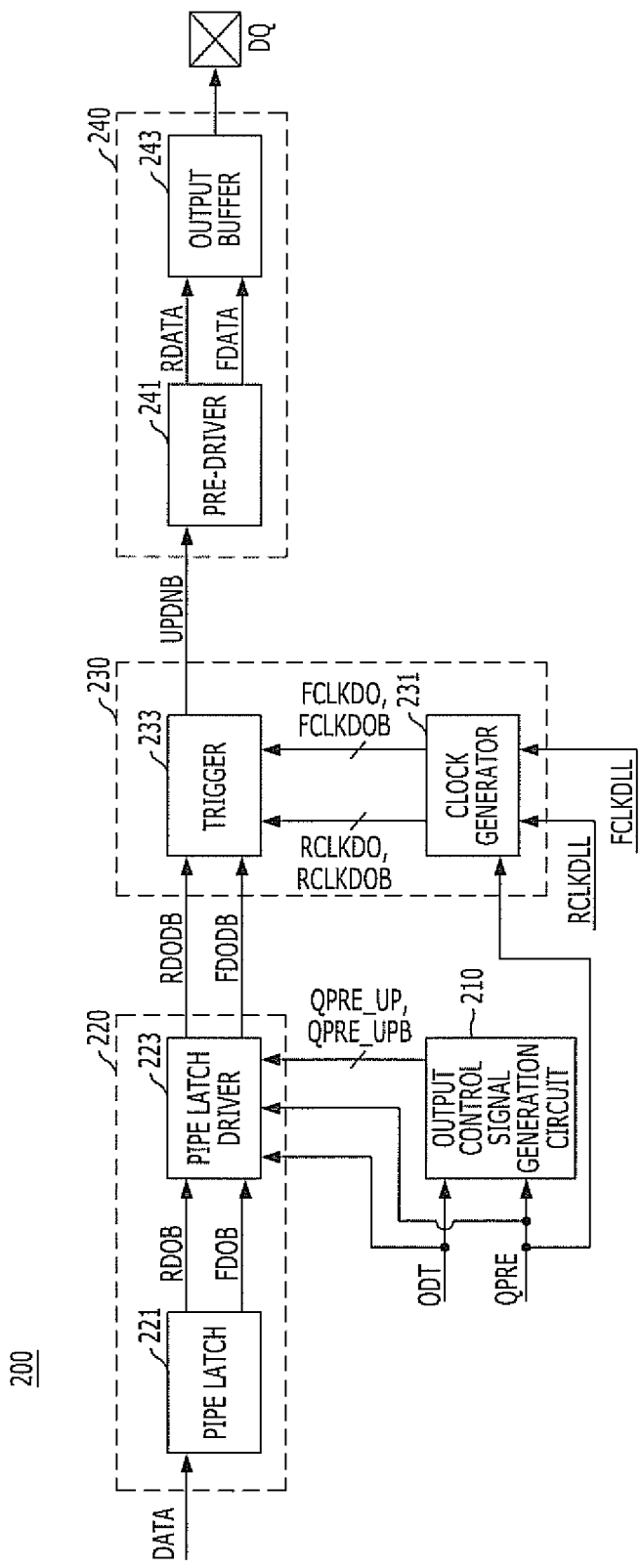
FIG. 5 is a block diagram illustrating a semiconductor memory device in accordance with an exemplary embodiment of the present invention.

FIG. 5 is a block diagram illustrating a semiconductor memory device in accordance with an exemplary embodiment of the present invention.

Referring to FIG. 5, the semiconductor memory device 200 includes an output control signal generation circuit 210, a pipe latch circuit 220, a synchronization circuit 230, and an output driving circuit 240.

The output control signal generation circuit 210 generates output control signals QPRE_UP and QPRE_UPB according as any one of a first enable signal ODT for enabling an on die termination (ODT) unit and a second enable signal QPRE that is enabled in response to a preamble period of a data strobe signal DQS is enabled. The pipe latch circuit 220 receives parallel data DATA to output data RDODB and FDODB in series through its output terminals, or sets the output terminals at a predetermined voltage level, in response to the first enable signal ODT, the second enable signal QPRE, and the output control signals QPRE_UP and QPRE_UPB. The synchronization circuit 230 receives the data RDODB and FDODB of the pipe latch circuit 220 to output data UPDNB in synchronization with internal clocks RCLKDLL and FCLKDLL. The output driving circuit 240 outputs the data UPDNB outputted from the synchronization circuit 230 to a data pad DQ.

Herein, although circuits for generating the internal clocks RCLKDLL and FCLKDLL are not illustrated in the drawing, they may be generated in, for example, a Delay Locked Loop (DLL) and toggled in a period where a data is outputted based on column address strobe (CAS) latency information and burst length information. The internal clocks RCLKDLL and FCLKDLL include a first internal clock RCLKDLL which is synchronized with a rising edge of a delay locked loop clock generated in the DLL and a second internal clock FCLKDLL synchronized with a falling edge of the delay locked loop clock generated in the DLL.

In detail, the pipe latch circuit 220 includes a pipe latch 221 and a pipe latch driver 223. The pipe latch 221 receives the parallel data DATA to output serial data RDOB and FDOB in synchronization with rising and falling edges of a source clock (not shown). The pipe latch driver 223 receives the serial data RDOB and FDOB to output the data RDODB and FDODB through its output terminals or set the output terminals at a predetermined voltage level in response to the first enable signal ODT, the second enable signal QPRE, and the output control signals QPRE_UP and QPRE_UPB.

The synchronization circuit 230 includes a clock generator 231 and a trigger 233. The clock generator 231 generates differential internal clocks RCLKDO, RCLKDOB, FCLKDO, and FCLKDOB corresponding to the internal clocks RCLKDLL and FCLKDLL. The trigger 233 receives the data RDODB and FDODB of the pipe latch circuit 220 and outputs the data UPDNB in synchronization with the differential internal clocks RCLKDO, RCLKDOB, FCLKDO, and FCLKDOB.

The output driving circuit 240 includes a pre-driver 241 and an output buffer 243. The pre-driver 241 controls slew rate of the data UPDNB of the trigger 233. The output buffer 243 receives data RDATA and FDATA of the pre-driver 241.

Figure 6:
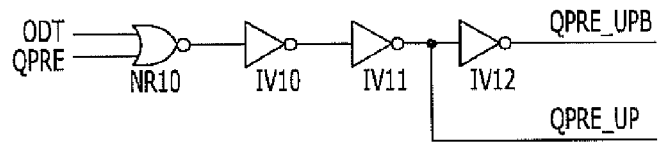
FIG. 6 is a block diagram illustrating an internal structure of an output control signal generation circuit shown in FIG. 5.

FIG. 6 is a block diagram illustrating an internal structure of the output control signal generation circuit 210 shown in FIG. 5.

Referring to FIG. 6, the output control signal generation circuit 210 includes a first NOR gate NR10, a first inverter IV10, a second inverter IV11, and a third inverter IV12. The first NOR gate NR10 performs a NOR operation onto the first enable signal ODT and the second enable signal QPRE. The first inverter IV10 inverts an output of the first NOR gate NR10. The second inverter IV11 inverts an output of the first inverter IV10 and outputs a first output control signal QPRE_UP. The third inverter IV12 inverts an output of the second inverter IV11 and outputs a second output control signal QPRE_UPB.

Figure 7:
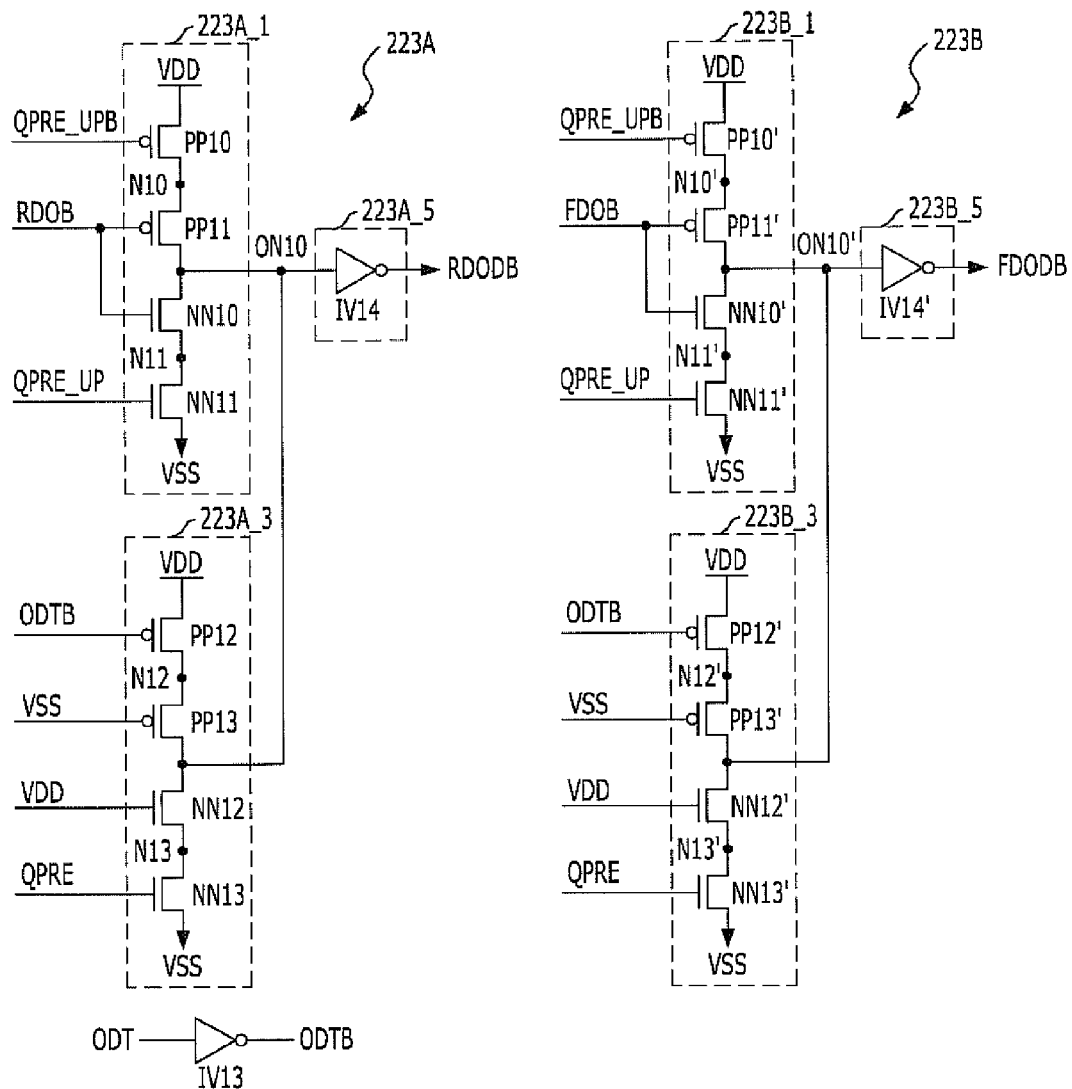
FIG. 7 is a block diagram illustrating an internal structure of a pipe latch driving unit shown in FIG. 5.

FIG. 7 is a block diagram illustrating an internal structure of the pipe latch driver 223 shown in FIG. 5.

The pipe latch driver 223 includes a first driving unit 223A and a second driving unit 223B. The first driving unit 223A outputs the data RDODB synchronized with the rising edge of the source clock, and the second driving unit 223B outputs the data FDODB synchronized with the falling edge of the source clock.

First, the first driving unit 223A includes a first data driving element 223A_1, a first fixed voltage driving element 223A_3, and a first output element 223A_5. The first data driving element 223A_1 drives the data RDOB among the data RDOB and FDOB in response to the first and second output control signals QPRE_UP and QPRE_UPB to a first output node ON10. The data RDOB and FDOB are serially outputted through the pipe latch 221 and the data RDOB is synchronized with the rising edge of the source clock. The first fixed voltage driving element 223A_3 drives the first output node ON10 with a power source voltage VDD or a ground voltage VSS in response to the first enable signal ODT and the second enable signal QPRE. The first output element 223A_5 is coupled with the first output node ON10 and outputs the data RDODB synchronized with the rising edge of the source clock. As a result, the data RDODB may be fixed to the power source voltage VDD or the ground voltage VSS in response to the first enable signal ODT and the second enable signal QPRE.

Herein, the first data driving element 223A_1 includes a first PMOS transistor PP10, a second PMOS transistor PP11, a first NMOS transistor NN10, and a second NMOS transistor NN11. The first PMOS transistor PP10 receives the second output control signal QPRE_UPB through a gate and includes a source and a drain coupled between a power source voltage (VDD) terminal and a first coupling node N10. The second PMOS transistor PP11 receives the data RDOB synchronized with the rising edge of the source clock through a gate and includes a source and a drain coupled between the first coupling node N10 and the first output node ON10. The first NMOS transistor NN10 receives the data RDOB through a gate and includes a drain and a source coupled between the first output node ON10 and a second coupling node N11. The second NMOS transistor NN11 receives first output control signal QPRE_UP through a gate and includes a drain and a source coupled between the second coupling node N11 and a ground voltage (VSS) terminal.

The first fixed voltage driving element 223A_3 includes a third PMOS transistor PP12, a fourth PMOS transistor PP13, a third NMOS transistor NN12, and a fourth NMOS transistor NN13. The third PMOS transistor PP12 receives the inverted first enable signal ODTB through a gate and includes a source and a drain coupled between the power source voltage (VDD) terminal and a third coupling node N12. The fourth PMOS transistor PP13 receives a ground voltage VSS through a gate and includes a source and a drain coupled between the third coupling node N12 and the first output node ON10. The third NMOS transistor NN12 receives the power source voltage VDD through a gate and includes a drain and a source coupled between the first output node ON10 and a fourth coupling node N13. The fourth NMOS transistor NN13 receives the second enable signal QPRE through a gate and includes a drain and a source coupled between a fourth coupling node N13 and the ground voltage (VSS) terminal.

The first output element 223A_5 includes a fifth inverter IV14 for inverting a signal at the first output node ON10 and outputting the data RDODB synchronized with the rising edge of the source clock. Meanwhile, since the second driving unit 223B has the same structure as the first driving unit 223A, except that the data FDOB synchronized with the falling edge of the source clock is inputted, for the sake of convenience, further descriptions on the second driving unit 223B is omitted herein.

Figure 8:
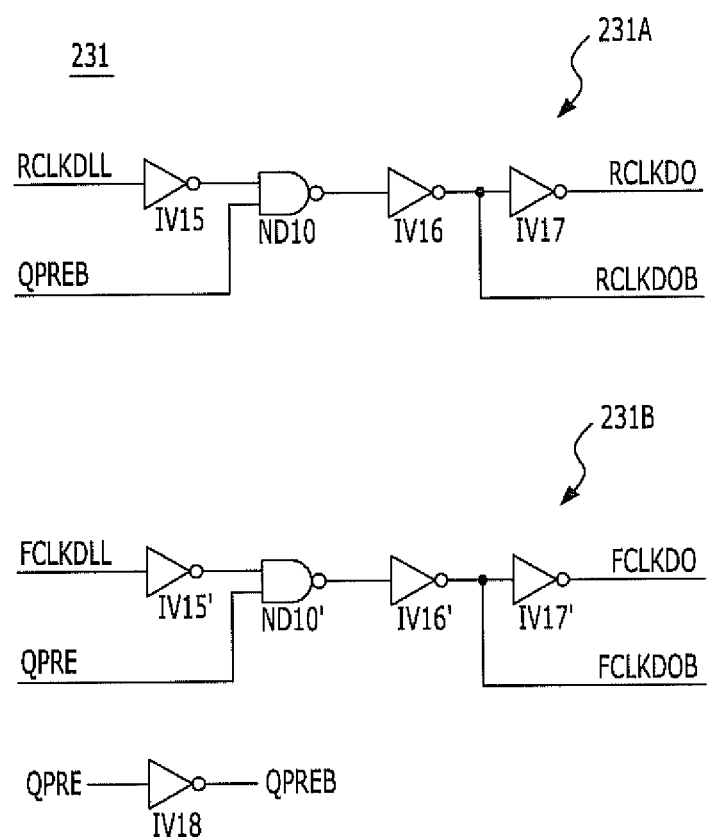
FIG. 8 is a block diagram illustrating an internal structure of a clock generator shown in FIG. 5.

FIG. 8 is a block diagram illustrating an internal structure of the clock generator 231 shown in FIG. 5.

Referring to FIG. 8, the clock generator 231 includes a first clock generation unit 231A and a second clock generation unit 231B. The first clock generation unit 231A generates first differential internal clocks RCLKDO and RCLKDOB which correspond to the internal clock RCLKDLL synchronized with a rising edge of the delay locked loop clock. The second clock generation unit 231B generates second differential internal clocks FCLKDO and FCLKDOB which correspond to the internal clock FCLKDLL synchronized with a falling edge of a delay locked loop clock. Since the first clock generation unit 231A and the second clock generation unit 231B have the same structure, the internal structure of the first clock generation unit 231A will be described hereinafter only for illustrative purpose.

The first clock generation unit 231A includes a sixth inverter IV15, a first NAND gate ND10, a seventh inverter IV16, and an eighth inverter IN17. The sixth inverter IV15 inverts the first internal clock RCLKDLL. The first NAND gate ND10 performs a NAND operation onto an output of the sixth inverter IV15 and an inverted second enable signal QPREB. The seventh inverter IV16 inverts an output of the first NAND gate ND10 to output a first differential internal clock bar RCLKDOB. The eighth inverter IN17 inverts an output of the seventh inverter IV16 to output a first differential internal clock RCLKDO.

The clock generator 231 having the above structure generates the first differential internal clocks RCLKDO and RCLKDOB synchronized with a rising edge of the internal clock RCLKDLL, and the second differential internal clocks FCLKDO and FCLKDOB synchronized with a rising edge of the internal clocks FCLKDLL, respectively. Herein, the first differential internal clocks RCLKDO and RCLKDOB and the second differential internal clocks FCLKDO and FCLKDOB are generated to have a restricted or predetermined toggling period in response to the inverted second enable signal QPREB and the second enable signal QPRE.

Figure 9:
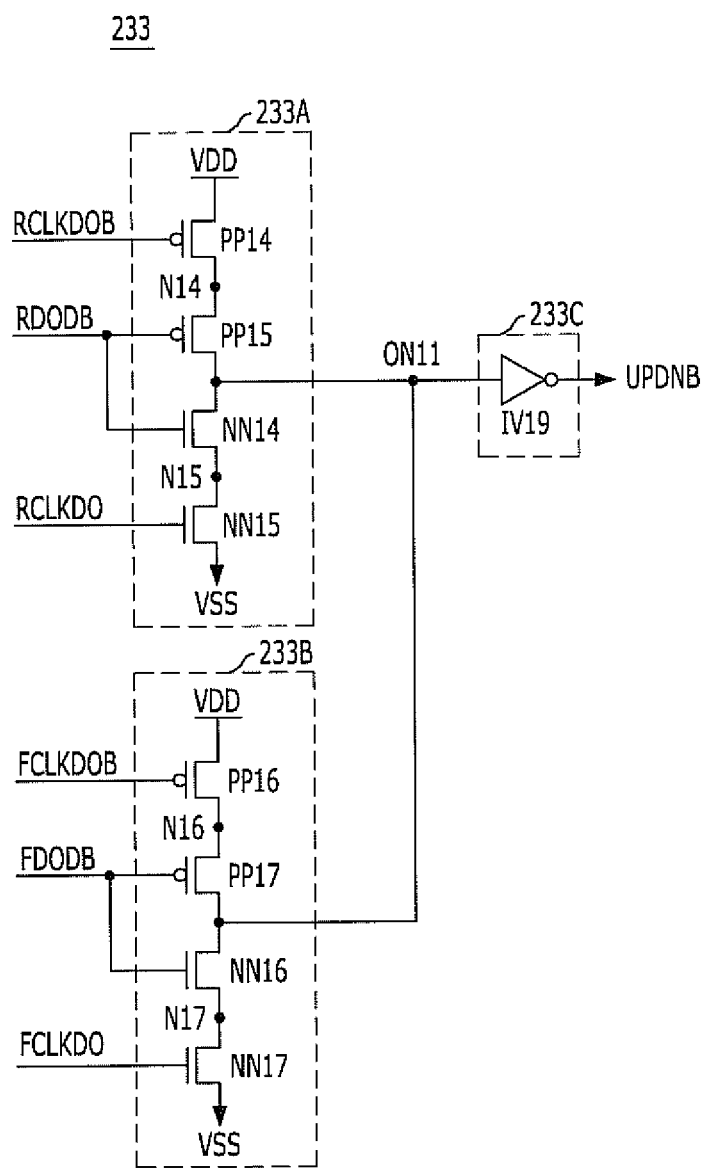
FIG. 9 is a block diagram illustrating an internal structure of a trigger shown in FIG. 5.

FIG. 9 is a block diagram illustrating an internal structure of the trigger 233 shown in FIG. 5.

Referring to FIG. 9, the trigger 233 includes a first synchronization unit 233A, a second synchronization unit 233B, and an output unit 233C. The first synchronization unit 233A receives the data RDODB, which is outputted from the pipe latch circuit 220 and synchronized with the rising edge of the source clock, and outputs the data RDODB to a second output node ON11 in synchronization with the first differential internal clocks RCLKDO and RCLKDOB. The second synchronization unit 233B receives the data FDODB, which is outputted from the pipe latch circuit 220 and synchronized with the falling edge of the source clock, and outputs the data FDODB to the second output node ON11 in synchronization with the second differential internal clocks FCLKDO and FCLKDOB. The output unit 233C is coupled with the second output node ON11 and outputs the data UPDNB synchronized with the internal clocks RCLKDLL and FCLKDLL.

Herein, the first synchronization unit 233A includes a fifth PMOS transistor PP14, a sixth PMOS transistor PP15, a fifth NMOS transistor NN14, and a sixth NMOS transistor NN15. The fifth PMOS transistor PP14 receives the first differential internal clock bar RCLKDOB through a gate and includes a source and a drain coupled between the power source voltage (VDD) terminal and a fifth coupling node N14. The sixth PMOS transistor PP15 receives the data RDODB through a gate and includes a source and a drain coupled between the fifth coupling node N14 and the second output node ON11. The fifth NMOS transistor NN14 receives the data RDODB through a gate and includes a drain and a source coupled between the second output node ON11 and a sixth coupling node N15. The sixth NMOS transistor NN15 receives the first differential internal clock RCLKDO through a gate and includes a drain and a source coupled between the sixth coupling node N15 and the ground voltage (VSS) terminal.

The second synchronization unit 233B includes a seventh PMOS transistor PP16, an eighth PMOS transistor PP17, a seventh NMOS transistor NN16, and an eighth NMOS transistor NN17. The seventh PMOS transistor PP16 receives a second differential internal clock bar FCLKDOB through a gate and includes a source and a drain coupled between the power source voltage (VDD) terminal and a seventh coupling node N16. The eighth PMOS transistor PP17 receives the data FDODB through a gate and includes a source and a drain coupled between the seventh coupling node N16 and the second output node ON11. The seventh NMOS transistor NN16 receives the data FDODB through a gate and includes a drain and a source coupled between the second output node ON11 and an eighth coupling node N17. The eighth NMOS transistor NN17 receives a second differential internal clock FCLKDO through a gate and includes a drain and a source coupled between the eighth coupling node N17 and the ground voltage (VSS) terminal.

Also, the output unit 233C includes a tenth inverter IV19 for inverting a signal at the second output node ON11 and outputting a data UPDNB synchronized with the internal clocks RCLKDLL and FCLKDLL.

Hereafter, an operation of the semiconductor memory device having the above-described structure in accordance with an exemplary embodiment of the present invention is described.

First, a process performed in a read operation mode is described.

When the first enable signal ODT and the second enable signal QPRE are inactivated to a logic low level and data DATA are read from a memory cell region (not shown) in response to a read command, the pipe latch 221 converts parallel data DATA into serial data RODB and FDOB and outputs the serial data RODB and FDOB to the pipe latch driver 223 in synchronization with rising and falling edges of a source clock. The pipe latch driver 223 drives the serial data RDOB and FDOB and outputs data RDODB and FDODB to the trigger 233. The trigger 233 synchronizes the data RDODB and FDODB with differential internal clocks RCLKDO, RCLKDOB, FCLKDO, and FCLKDOB and outputs data UPDNB to the pre-driver 241. The pre-driver 241 controls slew rate of the data UPDNB and outputs data RDATA and FDATA to the output buffer 243. The output buffer 243 receives the data RDATA and FDATA and outputs them to the data pad DQ. Accordingly, the data outputted from the data pad DQ may be synchronized with a system clock so as to stably perform a read operation.

Meanwhile, when the second enable signal QPRE having an enabling period corresponding to a preamble period of a data strobe signal DQS is activated to a logic high level during the read operation, the output control signal generation circuit 210 outputs the output control signals QPRE_UP and QPRE__UPB to be inactivated. Then, the operation of the data driving elements 223A_1 and 223B_1 included in the pipe latch driver 223 is ceased and the fixed voltage driving elements 223A_3 and 223B_3 included in the pipe latch driver 223 operate so as to set the output terminals of the pipe latch driver 223 to a logic high level. Accordingly, the output terminal of the trigger 233 is set to a logic high level and eventually the output terminal of the output buffer 243 is set to a predetermined voltage level, e.g., a logic high level. The above status is informed as a preamble period of the data strobe signal DQS Subsequently, a process performed in an ODT mode will be described hereinafter.

When the first enable signal ODT is enabled to a logic high level and the semiconductor memory device enters the ODT mode, the output control signal generation circuit 210 outputs the output control signals QPRE_UP and QPRE_UPB to be inactivated, Then, the operation of the data driving elements 223A_1 and 223B_1 included in the pipe latch driver 223 is ceased, and the fixed voltage driving elements 223A_3 and 223B_3 included in the pipe latch driver 223 operate so as to set the output terminals of the pipe latch driver 223 to a logic low level. As a result, the output terminal of the trigger 233 is set to a logic low level and any one of a pull-up operation and a pull-down operation included in the pre-driver 241 and the output buffer 243 is performed. That is, the pre-driver 241 and the output buffer 243 are used as an on die termination (ODT) unit.

According to the exemplary embodiment of the present invention, an improved pipe latch driver 223 is arranged in the front part of the trigger for outputting data in synchronization with a clock generated in the Delay Locked Loop (DLL) and includes devices controlled by the first enable signal ODT and the second enable signal QPRE so that the duty characteristic of data outputted from the trigger may be improved in an effective manner. Therefore, it may be possible to acquire competitiveness in a high frequency and low power source environment.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a pipe latch circuit configured to receive parallel input data and output serial data or set an output terminal of the pipe latch circuit at a predetermined voltage level in response to an enable signal; and
a synchronization circuit configured to output an output data of the pipe latch circuit in synchronization with an internal clock,
wherein the enable signal comprises an On Die Termination enabling signal, and
the pipe latch circuit is configured to set the output terminal of the pipe latch circuit at the predetermined voltage level when the enable signal is enabled.

2. The semiconductor memory device of claim 1, wherein the internal clock comprises a clock generated in a delay locked loop (DLL).

3. The semiconductor memory device of claim 2, wherein the internal clock is restrictively applied based on column address strobe (CAS) latency information and burst length information.

4. The semiconductor memory device of claim 1, wherein the pipe latch circuit comprises:
a pipe latch configured to receive the parallel input data and outputting the serial data; and a pipe latch driver configured to output the serial data, which are outputted from the pipe latch, through the output terminal of the pipe latch circuit, or set the output terminal of the pipe latch circuit at the predetermined voltage level in response to the enable signal.

5. The semiconductor memory device of claim 1, wherein the synchronization circuit comprises:
a clock generator configured to generate a differential internal clock corresponding to the internal clock; and
a trigger configured to output the output data of the pipe latch circuit in synchronization with the differential internal clock.

6. The semiconductor memory device of claim 1, further comprising:
an output driving circuit configured to output an output data of the trigger to a data pad.

7. A semiconductor memory device comprising:
an output control signal generation circuit configured to generate an output control signal, wherein the output control signal is enabled when any one of a first enable signal and a second enable signal is enabled;
a pipe latch circuit configured to receive parallel input data and output serial data through an output terminal of the pipe latch circuit or set the output terminal at a predetermined voltage level according to the first enable signal, the second enable signal, and the output control signal; and
a synchronization circuit configured to output an output data of the pipe latch circuit in synchronization with an internal clock,
wherein the first enable signal comprises an On Die Termination enabling signal.

8. The semiconductor memory device of claim 7, wherein the internal clock includes a clock generated in a delay locked loop (DLL).

9. The semiconductor memory device of claim 8, wherein the internal clock is restrictively applied based on CAS latency information and burst length information.

10. The semiconductor memory device of claim 7, wherein the pipe latch circuit comprises:
a pipe latch configured to receive the parallel input data and outputting the serial data; and
a pipe latch driver configured to output the serial data through the output terminal of the pipe latch circuit or setting the output terminal at the predetermined voltage level in response to the first enable signal, the second enable signal, and the output control signal.

11. The semiconductor memory device of claim 10, wherein the pipe latch driver comprises:
a first driving unit configured to transfer the serial data that are outputted from the pipe latch to the output terminal in response to the output control signal; and
a second driving unit configured to drive the output terminal of the pipe latch circuit with one of a first voltage and a second voltage in response to the first enable signal and the second enable signal.

12. The semiconductor memory device of claim 7, wherein the synchronization circuit comprises:
a clock generator configured to generate a differential internal clock corresponding to the internal clock; and
a trigger configured to outputting the output data of the pipe latch circuit in synchronization with the differential internal clock.

13. The semiconductor memory device of claim 12, wherein the clock generator is configured to generate the differential internal clock with a restrictive toggling period in response to the second enable signal.

14. The semiconductor memory device of claim 12, wherein the internal clock comprises a delay locked loop clock and the clock generator comprises:
a first differential clock generation unit configured to generate a first differential internal clock synchronized with a rising edge of the delay locked loop clock; and
a second differential clock generation unit configured to generating a second differential internal clock synchronized with a falling edge of the delay locked loop clock.

15. The semiconductor memory device of claim 14, wherein the trigger comprises:
a first synchronization unit configured to output the output data of the pipe latch circuit in synchronization with the first differential internal clock; and
a second synchronization unit configured to output the output data of the pipe latch circuit in synchronization with the second differential internal clock.

16. The semiconductor memory device of claim 7, further comprising an output driving circuit configured to output an output data of the synchronization circuit to a data pad.

17. The semiconductor memory device of claim 16, wherein the output driving circuit comprises:
a pre-driver configured to control a slew rate of an output data of the trigger; and
an output buffer configured to output an output data of the pre-driver to the data pad.

* * * * *

UNITED STATES PATENT AND TRADEMARK OFFICE
CERTIFICATE OF CORRECTION

| | |
|---|---|
| PATENT NO. | : 8,780,646 B2 |
| APPLICATION NO. | : 13/404734 |
| DATED | : July 15, 2014 |
| INVENTOR(S) | : Yong-Mi Kim |

Page 1 of 1

It is certified that error appears in the above-identified patent and that said Letters Patent is hereby corrected as shown below:

On the title page item (75), should read:

Yong-Mi Kim, Gyeonggi-do (KR)

Signed and Sealed this
Seventh Day of October, 2014

Michelle K. Lee
*Deputy Director of the United States Patent and Trademark Office*